US009473128B2

(12) United States Patent
Wang et al.

(10) Patent No.: US 9,473,128 B2
(45) Date of Patent: Oct. 18, 2016

(54) DC VOLTAGE GENERATION CIRCUIT AND PULSE GENERATION CIRCUIT THEREOF

(71) Applicant: REALTEK SEMICONDUCTOR CORPORATION, Hsinchu (TW)

(72) Inventors: Shih-Cheng Wang, Taichung (TW); Shih-Chieh Chen, Yilan County (TW); Jian-Ru Lin, Nantou County (TW); Chih-Cheng Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 13 days.

(21) Appl. No.: 14/620,972

(22) Filed: Feb. 12, 2015

(65) Prior Publication Data

US 2015/0256076 A1   Sep. 10, 2015

(30) Foreign Application Priority Data

Mar. 10, 2014 (TW) .............................. 103108258 A

(51) Int. Cl.
*H02M 3/158* (2006.01)
*H03K 5/13* (2014.01)
*H03K 5/151* (2006.01)
*H03K 17/16* (2006.01)
*H03K 5/00* (2006.01)

(52) U.S. Cl.
CPC .............. *H03K 5/13* (2013.01); *H03K 5/1515* (2013.01); *H03K 17/162* (2013.01); *H03K 2005/00019* (2013.01)

(58) Field of Classification Search
CPC ........................ H02M 3/158; H03K 3/356104; H03K 5/13
See application file for complete search history.

(56) References Cited

U.S. PATENT DOCUMENTS

| 5,977,801 | A | * | 11/1999 | Boerstler | .............. | H03L 7/0891 |
| | | | | | | 327/12 |
| 6,114,889 | A | | 9/2000 | Lee | | |
| 7,294,992 | B2 | * | 11/2007 | Yoshikawa | ............. | H02M 1/38 |
| | | | | | | 323/222 |
| 2007/0019450 | A1 | * | 1/2007 | Tiew | ..................... | H02M 3/156 |
| | | | | | | 363/98 |
| 2010/0156376 | A1 | * | 6/2010 | Fu | ............................ | H02M 1/38 |
| | | | | | | 323/283 |
| 2010/0231270 | A1 | | 9/2010 | Sasaki | | |
| 2014/0327422 | A1 | * | 11/2014 | Rommel | ............ | H03K 17/0822 |
| | | | | | | 323/283 |
| 2015/0008891 | A1 | * | 1/2015 | Li | ......................... | H02M 3/158 |
| | | | | | | 323/271 |
| 2015/0256075 | A1 | * | 9/2015 | Lin | ....................... | H02M 3/158 |
| | | | | | | 323/271 |

OTHER PUBLICATIONS

Office Action dated Nov. 17, 2015 for counterpart Taiwan Patent application 103108258.

(Continued)

*Primary Examiner* — Emily P Pham
(74) *Attorney, Agent, or Firm* — WPAT, P.C., Intellectual Property Attorneys; Anthony King

(57) ABSTRACT

A pulse generation circuit for outputting a pulse signal at an output terminal, including: a PMOS, an NMOS, and a logic circuit. The PMOS has a source coupled to a first reference voltage level, a drain coupled to the output terminal, and a gate that receives a first gate control signal. The NMOS has a source coupled to a second reference voltage level, a drain coupled to the output terminal, and a gate that receives a second gate control signal. The logic circuit generates the first gate control signal according to a control signal and a first delay signal and generates the second gate control signal according to the control signal and a second delay signal. The first delay signal is relevant to the second gate control signal and the control signal. The second delay signal is relevant to the first gate control signal and the control signal.

20 Claims, 11 Drawing Sheets

(56) References Cited

OTHER PUBLICATIONS

English abstract translation of the Office Action dated Nov. 17, 2015 for counterpart Taiwan Patent application 103108258.
Search report dated Nov. 17, 2015 for counterpart Taiwan Patent application 103108258.
Office Action of the counterpart TW application 103108259 dated Apr. 24, 2015.
Search Report of the counterpart TW application 103108259 dated Apr. 24, 2015.
Abstract translation of the Office Action of the counterpart TW application 103108259 dated Apr. 24, 2015.

* cited by examiner

DC VOLTAGE GENERATION CIRCUIT AND PULSE GENERATION CIRCUIT THEREOF

BACKGROUND OF THE INVENTION

1. Field of the Invention

The present invention relates to a DC (Direct Current) voltage generation circuit and a pulse generation circuit thereof, especially to a DC voltage generation circuit and a pulse generation circuit thereof that prevent short current from occurring.

2. Description of Related Art

Please refer to FIG. 1, illustrating a circuit of a conventional switching regulator. The switching regulator 100 comprises a PMOS 110 and an NMOS 120, connecting in series between a DC voltage level Vcc and ground. The PMOS 110 has its source coupled to the DC voltage level Vcc and its drain coupled to the node LX, and the NMOS 120 has its source coupled to ground and its drain coupled to the node LX. The on/off state of the PMOS 110 is controlled by the gate control signal PG. When the gate control signal PG is at low level the PMOS 110 is on, and when the gate control signal PG is at high level the PMOS 110 is off. The on/off state of the NMOS 120 is controlled by the gate control signal NG. When the gate control signal NG is at high level the NMOS 120 is on, and when the gate control signal NG is at low level the NMOS 120 is off. The gate control signal PG and the gate control signal NG become a delay signal PD and a delay signal ND after passing through a delay unit 142 and a delay unit 132 respectively. The delay signal ND is inverted by a NOT gate 134 before being input to a NAND gate 136, which receives a control signal CTRL at its other terminal and outputs the gate control signal PG at its output terminal; similarly, the delay signal PD is inverted by a NOT gate 144 before being input to a NOR gate 146, which receives the control signal CTRL at its other terminal and outputs the gate control signal NG at its output terminal.

Please refer to FIG. 2, illustrating a timing diagram of the control signals and the delay signals of the conventional switching regulator 100. When the control signal CTRL transits from low level to high level (in order to turn on the PMOS 110), the gate control signal NG transits immediately from high level to low level, which immediately turns off the NMOS 120 to prevent the PMOS 110 and the NMOS 120 from turning on at the same time. After a delay time Td, the delay signal ND transits from high level to low level. As the inversion of the delay signal ND and the control signal CTRL both are at high level at the time, the gate control signal PG outputted by the NAND gate 136 transits to low level; namely, the PMOS 110 turns on at a delay time Td after the NMOS 120 turns off. After another delay time Td, the delay signal PD transits from high level to low level, reflecting the on state of the PMOS 110. After an enabling time Ton the control signal CTRL transits from high level to low level (in order to turn on the NMOS 120), which in turn makes the gate control signal PG transit immediately from low level to high level to turn off the PMOS 110 immediately so that the PMOS 110 and the NMOS 120 do not turn on at the same time. After the delay time Td, the delay signal PD transits from low level to high level. As the inversion of the delay signal PD and the control signal CTRL both are at low level at the time, the gate control signal NG outputted by the NOR gate 146 transits to high level; namely, the NMOS 120 turns on at the delay time Td after the PMOS 110 turns off. After another same delay time Td, the delay signal ND transits from low level to high level, reflecting the on state of the NMOS 120. As a result, continuous pulse signals are generated at the node LX by adjusting the duty cycle of the control signal CTRL. After the pulse signals pass through a low-pass filter 150, which is comprised of an inductor 152 and a capacitor 154, a DC voltage is generated at the output terminal OUT.

The feature of the circuit shown in FIG. 1 is that the gate control signal PG and the gate control signal NG are fed back to the NMOS 120 and the PMOS 110 respectively after a delay time so that when the gate control signal PG is at low level the gate control signal NG is not at high level, avoiding a short current caused by simultaneously turning on of both the PMOS 110 and the NMOS 120. Therefore, this kind of circuit is referred to as a feedback delay control circuit. This circuit, however, has a main drawback that when the enabling time Ton of the control signal CTRL is greater than the delay time Td but less than twice the delay time Td, (i.e., Td<Ton<2Td), there is a possibility that the PMOS 110 and the NMOS 120 turns on at the same time, resulting in the occurrence of the shout current. Please refer to FIG. 3, illustrating another timing diagram of the control signals and the delay signals of the conventional switching regulator 100. When the gate control signal PG transits from high level to low level to turn on the PMOS 110, the delay signal PD will not reflect the on state of the PMOS 110 until a delay time Td has elapsed. If, within the delay time Td, the control signal CTRL transits from high level to low level (in order to turn on the NMOS 120), despite the gate control signal PG transits immediately from low level to high level to turn off the PMOS 110 immediately, the gate control signal NG transits immediately from low level to high level since the delay signal PD is still at high level at the time, resulting in a simultaneous transition of both the gate control signal PG and the gate control signal NG, as depicted by the dotted circle in FIG. 3. As a result, because of inherent circuit delay of the components, a short current that damages the circuit components may probably occur during the transition time of both the gate control signal PG and the gate control signal NG when the PMOS 110 and the NMOS 120 turn on at the same time. In short, a short current will occur if the enabling time Ton or the non-enabling time of the control signal CTRL is less than twice the delay time Td.

SUMMARY OF THE INVENTION

In consideration of the imperfections of the prior art, an object of the present invention is to provide a DC voltage generation circuit and a pulse generation circuit thereof, so as to make an improvement to the prior art.

The present invention discloses a pulse generation circuit for generating a pulse signal at an output terminal, comprising: a PMOS having a source coupled to a first reference voltage level, a drain coupled to the output terminal, and a gate coupled to receive a first gate control signal; an NMOS having a source coupled to a second voltage level, a drain coupled to the output terminal, and a gate coupled to receive a second gate control signal; and a logic circuit, coupled to the gate of the PMOS and the gate of the NMOS, for generating the first gate control signal according to a control signal and a first delay signal and generating the second gate control signal according to the control signal and a second delay signal. The first delay signal relates to the second gate control signal and the control signal, and the second delay signal relates to the first gate control signal and the control signal.

The present invention also discloses a DC voltage generation circuit for generating a DC voltage, comprising: a low-pass filter, having an input terminal and an output terminal, for filtering a pulse signal to generate the DC voltage, which is outputted at the output terminal; a PMOS having a source coupled to a first reference voltage level, a drain coupled to the input terminal of the low-pass filter, and a gate coupled to receive a first gate control signal, the pulse signal being generated at the drain of the PMOS; an NMOS having a source coupled to a second reference voltage level, a drain coupled to the input terminal of the low-pass filter, and a gate coupled to receive a second gate control signal, the pulse signal being generated at the drain of the NMOS; and a logic circuit, coupled to the gate of the PMOS and the gate of the NMOS, for generating the first gate control signal according to a control signal and a first delay signal, and generating the second gate control signal according to the control signal and a second delay signal. The first delay signal relates to the second gate control signal and the control signal, and the second delay signal relates to the first gate control signal and the control signal.

The DC voltage generation circuit of the present invention and a pulse generation circuit thereof refer to not only a delay signal but also the control signal CTRL to determine a gate control signal, which avoids a short current that occurs when the enabling or non-enabling time of the control signal CTRL is too short.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a DC voltage generation circuit and a pulse generation circuit thereof, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements.

Figure 1:
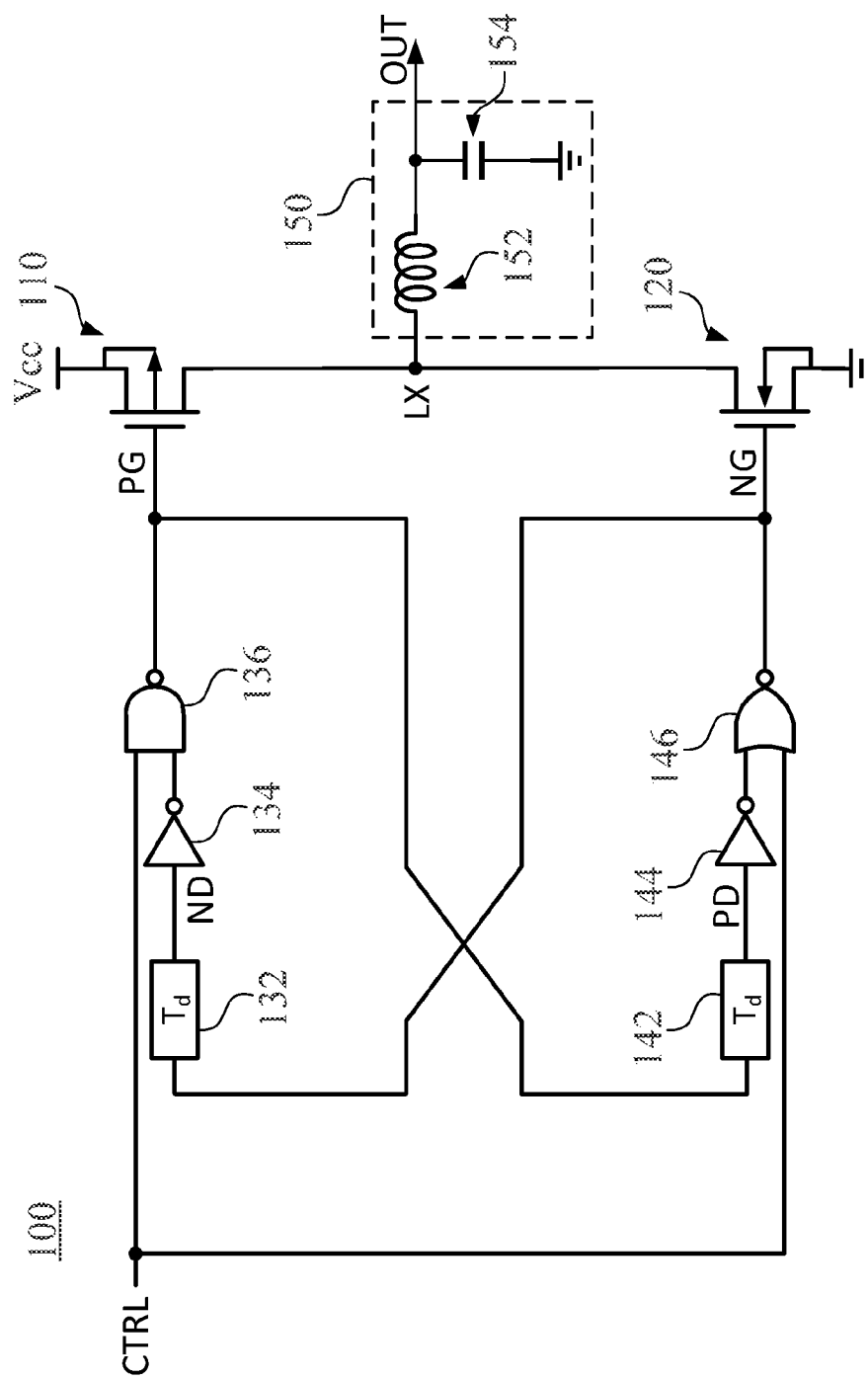
FIG. 1 illustrates a circuit of a conventional switching regulator.
Figure 2:
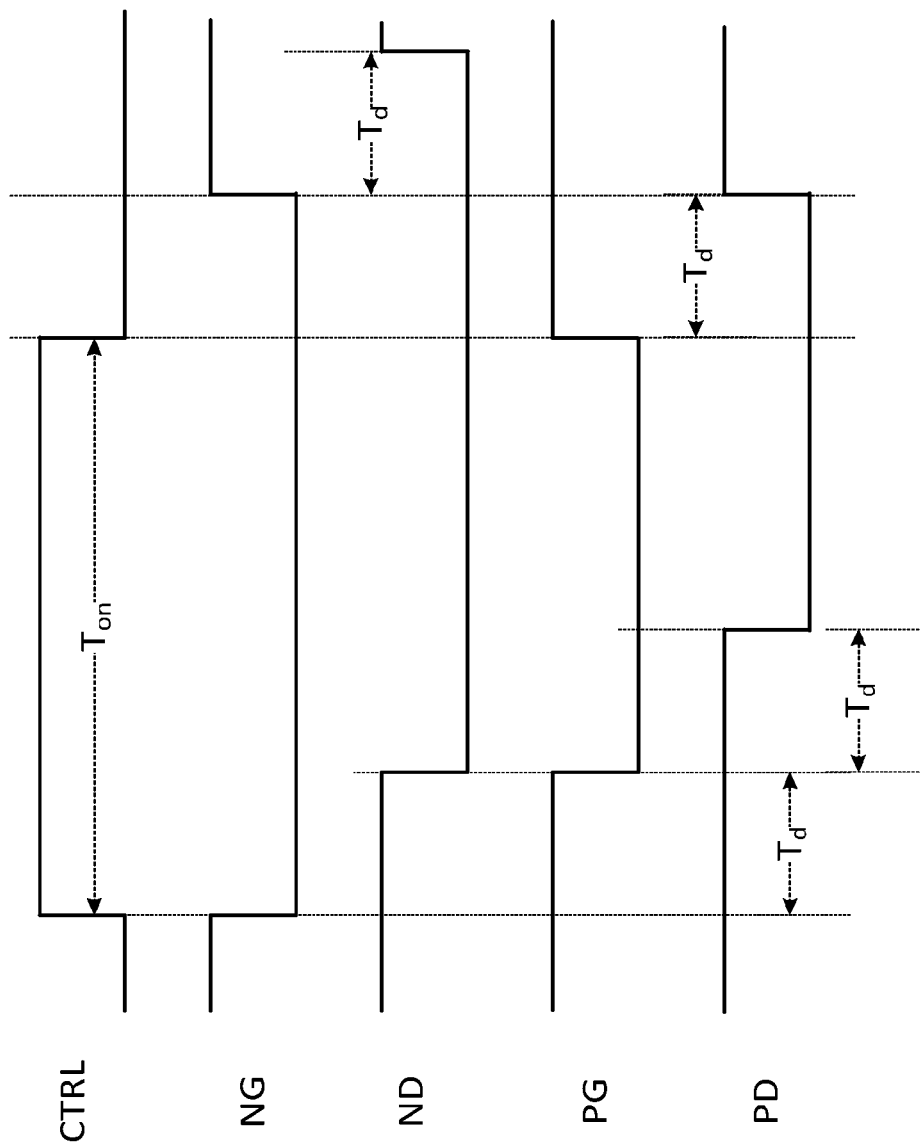
FIG. 2 illustrates a timing diagram of the control signals and the delay signals of the conventional switching regulator 100.
Figure 3:
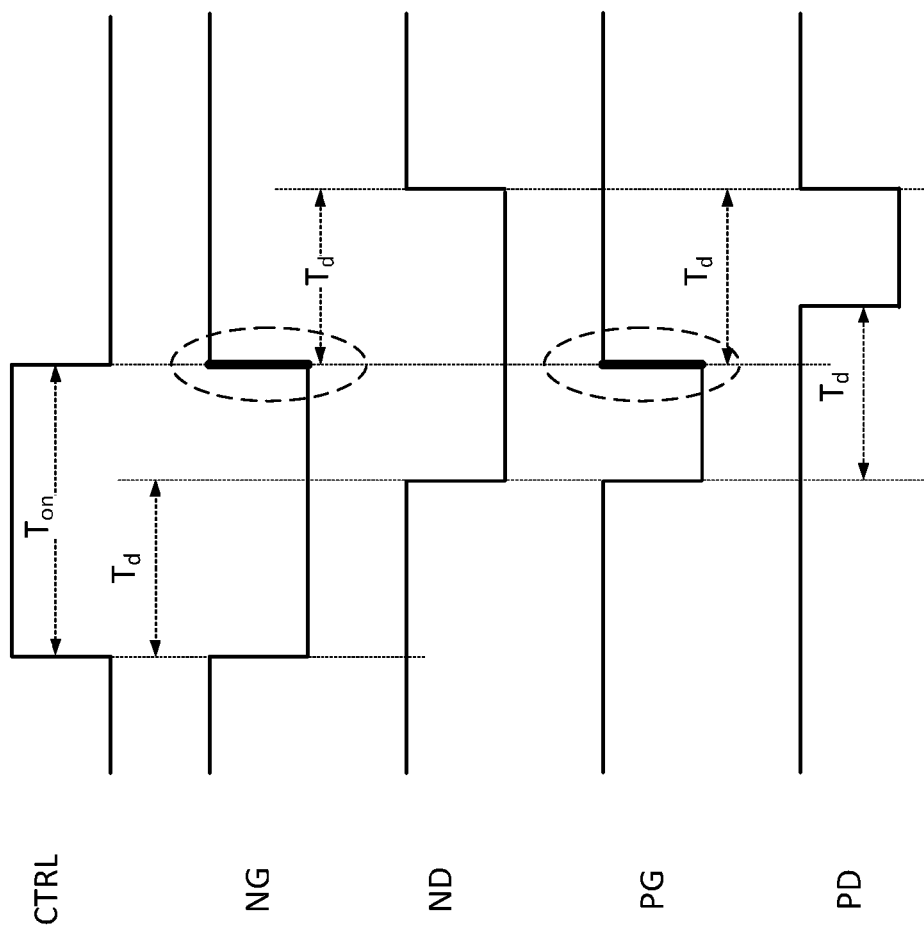
FIG. 3 illustrates another timing diagram of the control signals and the delay signals of the conventional switching regulator 100.
Figure 4:
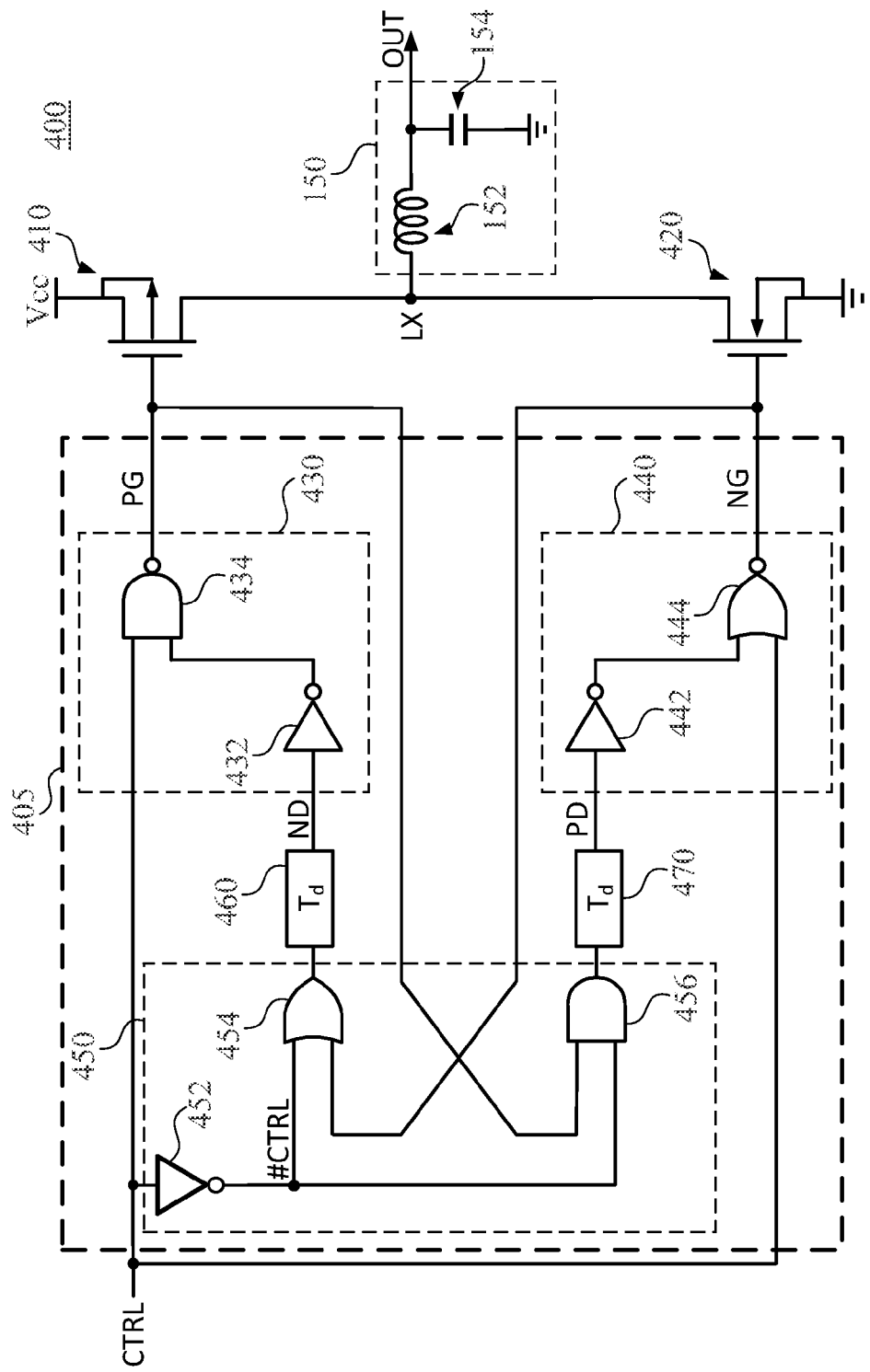
FIG. 4 illustrates a circuit of a switching regulator according to an embodiment of the present invention.

Please refer to FIG. 4, illustrating a circuit of a switching regulator according to an embodiment of the present invention. The switching regulator 400 comprises a low-pass filter 150, a PMOS 410 and an NMOS 420 which are connected in series between the DC voltage level Vcc and ground, and a logic circuit 405. The PMOS 410, the NMOS 420 and the logic circuit 405 together form a pulse generation circuit of the present invention, which generates pulse signals at the node LX. The PMOS 410 has its source coupled to the DC voltage level Vcc and its drain coupled to the node LX; the NMOS 420 has its source coupled to ground and its drain coupled to the node LX. The gates of the PMOS 410 and the NMOS 420 are coupled to the logic circuit 405, which outputs gate control signal PG and gate control signal NG to respectively control the on/off states of the PMOS 410 and the NMOS 420, and therefore pulse signals are generated at the node LX. A DC voltage is formed at the output terminal OUT after the pulse signals are filtered by the low-pass filter 150; therefore a switching regulator of the present invention can also be referred to as a DC voltage generator. Generally, the PMOS 410, the NMOS 420 and the logic circuit 405 locate inside a chip, while the low-pass filter 150 locates outside the chip and is connected to the chip via wirings on a circuit board. In other embodiments, the PMOS 410, the NMOS 420, the logic circuit 405 and the low-pass filter 150 can be all implemented inside a chip.

The logic circuit 405 generates the gate control signal PG according to the control signal CTRL and the delay signal ND, and generates the gate control signal NG according to the control signal CTRL and the delay signal PD. The delay signal ND is a logic operation result from the gate control signal NG and the control signal CTRL, and the delay signal PD is a logic operation result from the gate control signal PG and the control signal CTRL. The logic units included in the logic circuit 405 will be detailed below.

The logic circuit 405 comprises a logic unit 430, a logic unit 440, and a logic unit 450. The logic unit 450 comprises a NOT gate 452, an OR gate 454 and an AND gate 456. An inverted control signal #CTRL outputted by the NOT gate 452 is input to one terminal of the OR gate 454 and the AND gate 456 respectively. The other terminal of the OR gate 454 receives the gate control signal NG, and the logic signal outputted by the OR gate 454 is delayed by the delay unit 460 with a delay time Td to form the delay signal ND. The other terminal of the AND gate 456 receives the gate control signal PG, and the logic signal outputted by the AND gate 456 is delayed by the delay unit 470 with a delay time Td to form the delay signal PD. The logic unit 430 comprises a NOT gate 432 and a NAND gate 434. The delay signal ND is inverted by the NOT gate 432 before being input to one terminal of the NAND gate 434. The NAND gate 434 receives the control signal CTRL at its other terminal and outputs the gate control signal PG at its output terminal. In short, the gate control signal PG is generated by the logic unit 430 according to the control signal CTRL and the delay signal ND. On the other hand, the logic unit 440 comprises a NOT gate 442 and a NOR gate 444. The delay signal PD is inverted by the NOT gate 442 before being input to one terminal of the NOR gate 444. The NOR gate 444 receives the control signal CTRL at its other terminal and outputs the gate control signal NG at its output terminal. In short, the gate control signal NG is generated by the logic unit 440 according to the control signal CTRL and the delay signal PD.

Figure 5:
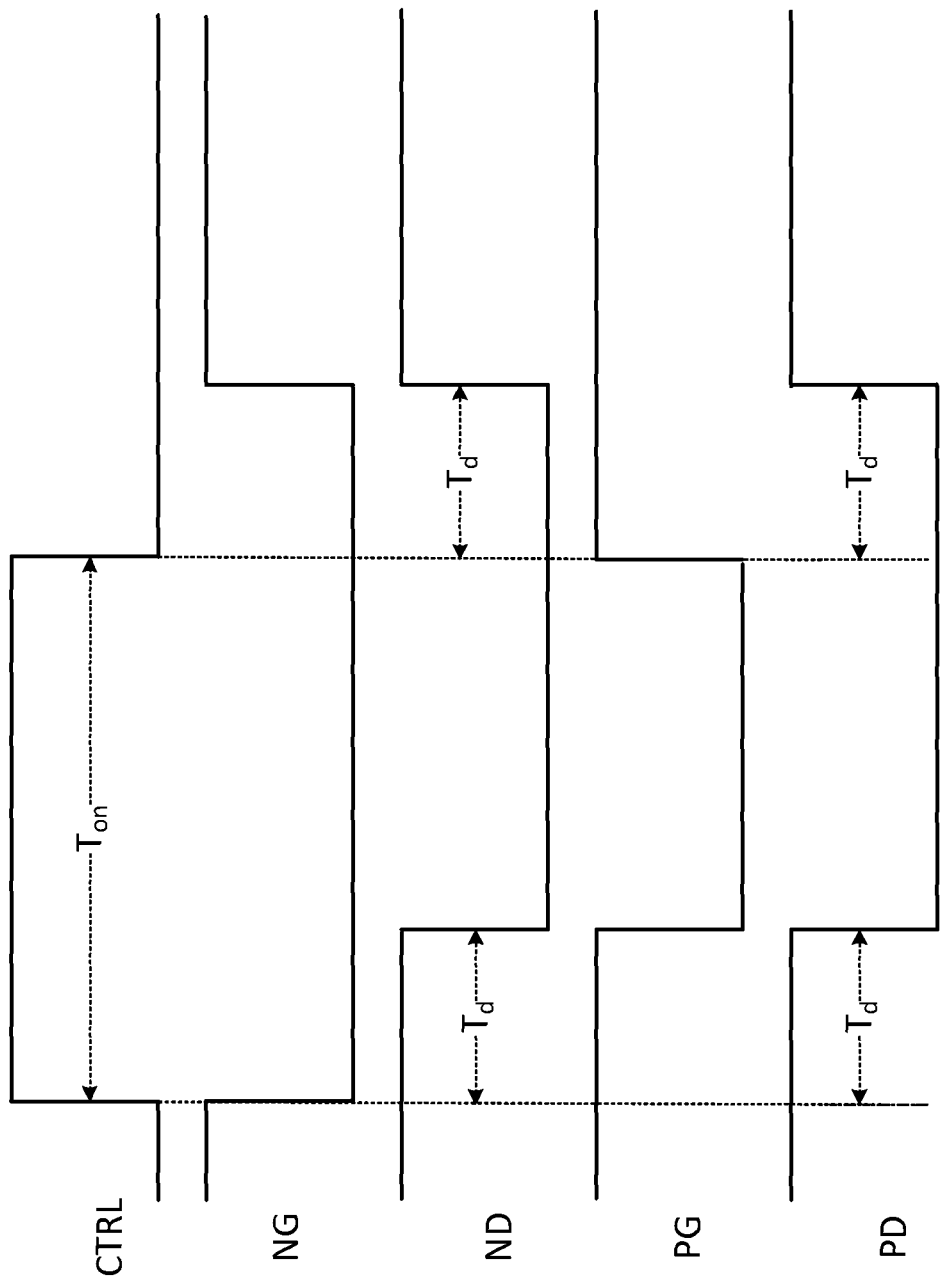
FIG. 5 illustrates a timing diagram of the control signals and the delay signals of the switching regulator 400.

The delay signal ND is dependent on the control signal CTRL and the gate control signal NG, and the delay signal PD is dependent on the control signal CTRL and the gate control signal PG. The advantages of such design can be appreciated by referring to the timing diagram of the switching regulator 400. Please refer to FIG. 5, illustrating a timing diagram of the control signals and the delay signals of the switching regulator 400. When the control signal CTRL transits from low level to high level (in order to turn on the PMOS 410), the gate control signal NG immediately transits from high level to low level in response to the operation of the NOR gate 444, promptly turning off the NMOS 420. By referring to the gate control signal NG and the inverted control signal #CTRL (i.e., an indirect reference to the control signal CTRL), the OR gate 454 transits its outputted logic signal from high level to low level, and then the delay signal ND correspondingly transits from high level to low level after a delay time Td, reflecting an off state of the NMOS 420. When the logic unit 430 learns from the control signal CTRL that the PMOS 410 is to be turned on and is certain, according to the delay signal ND, that the NMOS 420 has been turned off, the logic unit 430 transits the gate control signal PG from high level to low level to turn on the PMOS 410. On the other hand, when the control signal CTRL transits from low level to high level, the logic signal outputted by the AND gate 456 promptly transits to low level due to the operations of the NOT gate 452 and the AND gate 456; as a result, the delay signal PD also transits from high level to low level after a delay time Td by the delay unit 470. As shown in the timing diagram, the gate control signal PG and the delay signal PD transits level at the same time, indicating that the delay signal PD is able to reflect the on state of the PMOS 410 promptly. Similarly, when the control signal CTRL transits from high level to low level (in order to turn on the NMOS 420), the gate control signal PG immediately transits its level to turn off the PMOS 410, and then the logic unit 440 waits for the delay signal PD to transit level in order to be certain that the PMOS 410 is turned off before making the gate control signal NG transit from low level to high level to turn on the NMOS 420. On the other hand, because the OR gate 454 refers simultaneously to both the inverted control signal #CTRL and the gate control signal NG, the delay signal ND timely transits to reflect the on state of the NMOS 420 at a delay time Td after the transition of the control signal CTRL, rather than transiting after the gate control signal NG has already made its transition.

Figure 6:
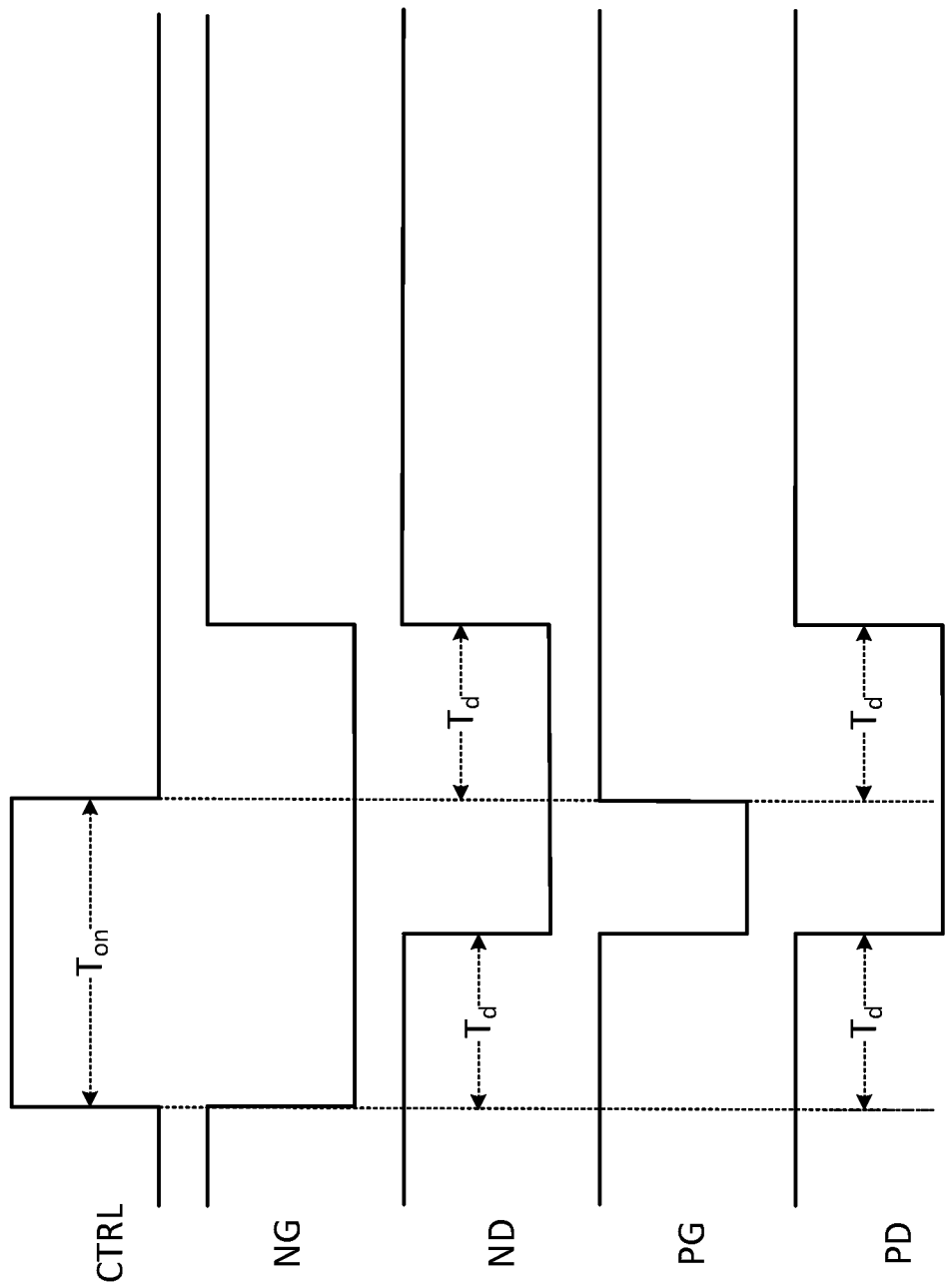
FIG. 6 illustrates another timing diagram of the control signals and the delay signals of the switching regulator 400 of the present invention.

The above-mentioned operations explain how the switching regulator 400 of the present invention solves the problems encountered by the conventional switching regulator. Please refer to FIG. 6, illustrating another timing diagram of the control signals and the delay signals of the switching regulator 400 of the present invention. When the enabling time Ton of the control signal CTRL is less than twice the delay time Td, the delay signal PD can indeed reflect that PMOS 410 is in the on state as the control signal CTRL transits from low level to high level. As the gate control signal PG makes the transition to turn off the PMOS 410, the gate control signal NG will not make the transition at the same time to turn on the NMOS 420, ensuring that the two transistors will not be turned on at the same time to avoid short currents. Similar protection mechanism also applies for the situation where the non-enabling time of the control signal CTRL is larger than the delay time Td but less than 2Td, and similar descriptions are therefore omitted for brevity.

Figure 7:
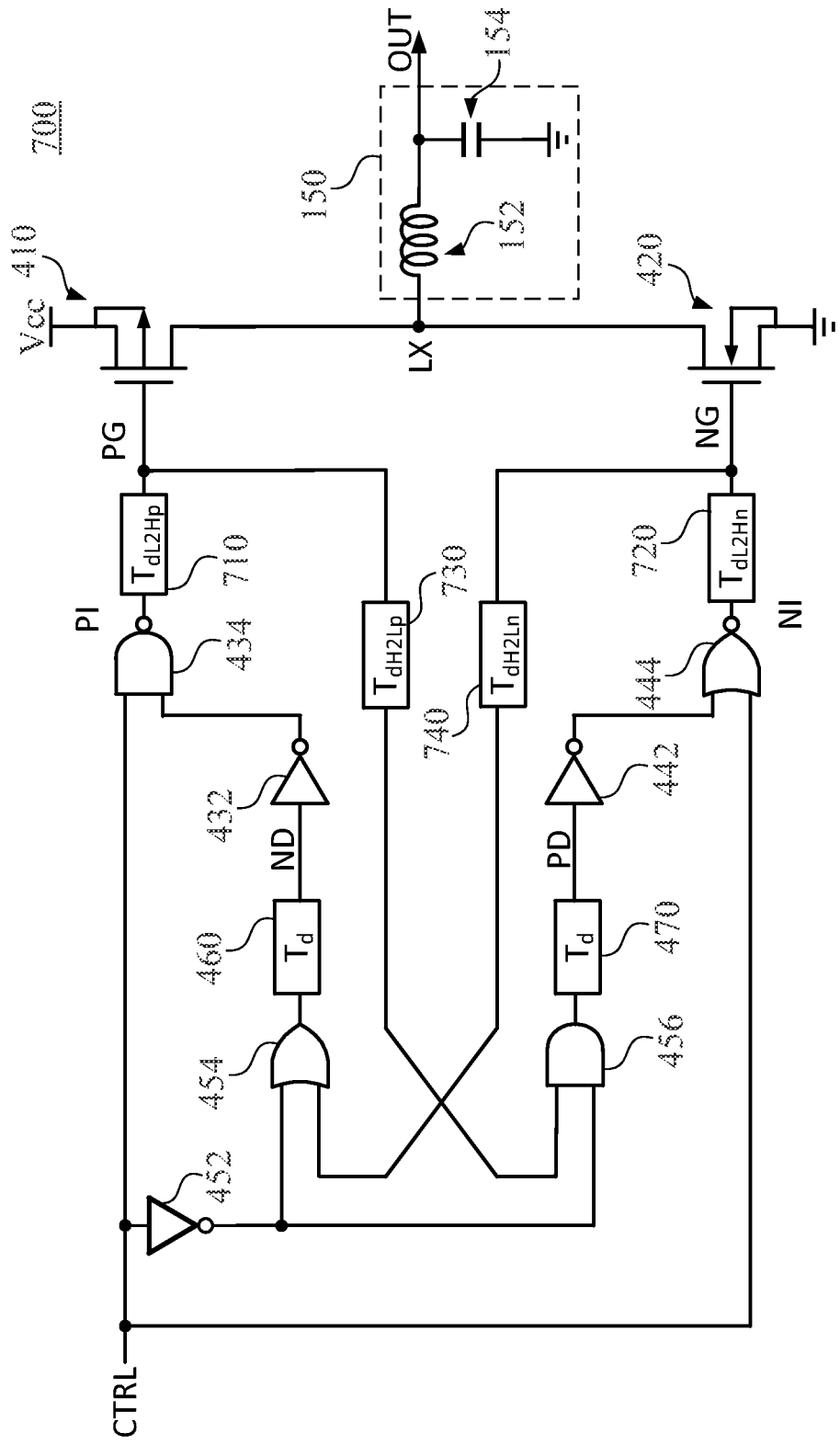
FIG. 7 illustrates a circuit of a switching regulator 700 with buck-boost converters of the present invention.
Figure 8:
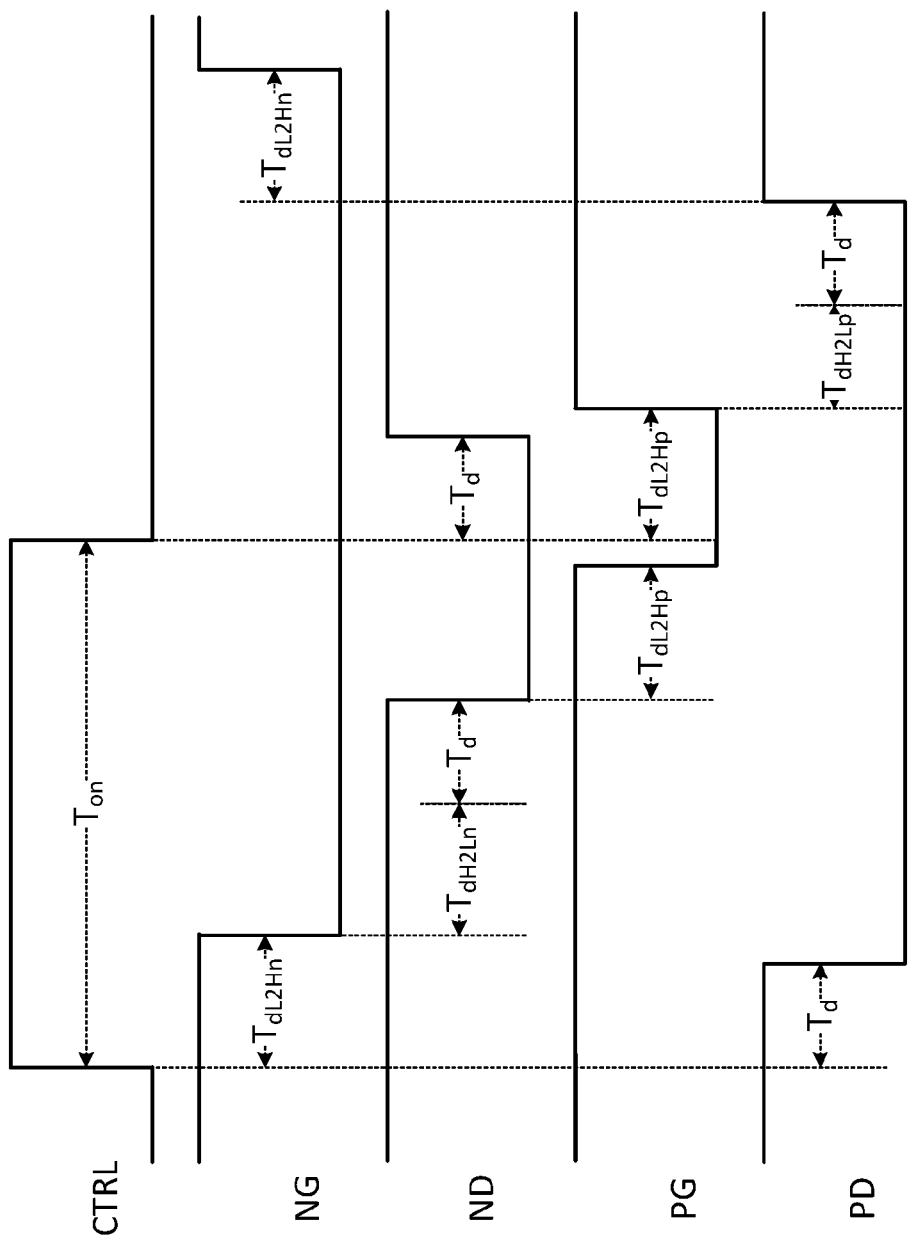
FIG. 8 illustrates a timing diagram of the control signals and the delay signals of the switching regulator 700 with buck-boost converters of the present invention.

Practically, because the PMOS 410 and the NMOS 420 require higher driving voltages while the logic circuit 405 requires only lower working voltages, buck-boost converters are necessary among the PMOS 410, the NMOS 420, and the logic circuit 405. Unfortunately, the buck-boost converters have parasitic delays, which cause additional delays to the control signals. Please refer to FIG. 7, illustrating a circuit of a switching regulator 700 with buck-boost converters according to one embodiment of the present invention. A boost converter 710 is to boost a voltage of a logic signal PI outputted by the NAND gate 434 to form the gate control signal PG, and a boost converter 720 is to boost a voltage of a logic signal NI outputted by the NOR gate 444 to form the gate control signal NG. The delay time of the boost converter 710 is TdL2Hp, and the delay time of the boost converter 720 is TdL2Hn. Similarly, a buck converter 730 and a buck converter 740 are to respectively buck voltages of the gate control signal PG and the gate control signal NG, and have delay time of TdH2Lp and TdH2Ln, respectively. Please refer to FIG. 8, illustrating a timing diagram of the control signals and the delay signals of the switching regulator 700 with buck-boost converters according to one embodiment of the present invention. In contract to FIG. 6, apparently the gate control signal PG, the gate control signal NG, the delay signal PD and the delay signal ND reflect the delays caused by the boost converter 710, the boost converter 720, the buck converter 730 and the buck converter 740, respectively. When the control signal CTRL transits from low level to high level (in order to turn on the PMOS 410), the delay signal PD reflects, after the delay time Td, that the PMOS 410 is ready to be turned on, regardless of whether the gate control signal PG has made its transition or not. So the NMOS 420 is ensured to remain at the off state, which prevents the PMOS 410 and the NMOS 420 from turning on at the same time, during a delay period from the transition of the control signal CTRL to its corresponding transition of the gate control signal PG, amounting to a total delay of TdL2Hn+TdH2Ln+Td+TdL2Hp. Based on the above descriptions, people having ordinary skill in the art can understand the operations when the control signal CTRL transits from high level to low level, so detailed descriptions are omitted for brevity.

Figure 9:
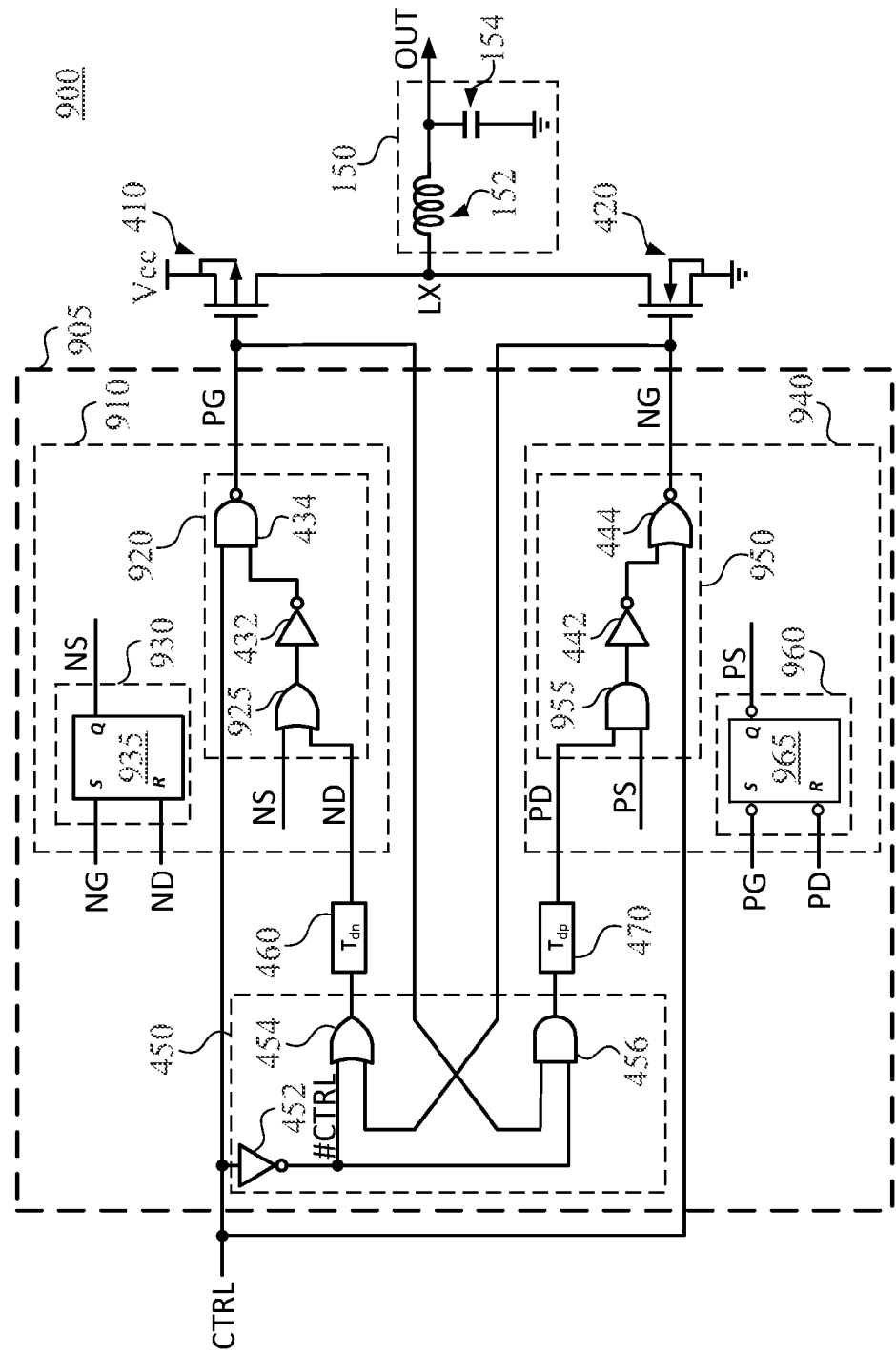
FIG. 9 illustrates a circuit of a switching regulator according to another embodiment of the present invention.

Please refer to FIG. 9, illustrating a circuit of a switching regulator according to another embodiment of the present invention. A switching regulator 900 comprises a low-pass filter 150, a PMOS 410, a NMOS 420 and a logic circuit 905. The PMOS 410, the NMOS 420 and the logic circuit 905 together form a pulse generation circuit of the present invention, which generates pulse signals at the node LX. The logic circuit 905 comprises a logic unit 910, a logic unit 940, a logic unit 450, a delay unit 460 and a delay unit 470. The logic unit 910 comprises a sub-logic unit 920 and a sub-logic unit 930, and the logic unit 940 comprises a sub-logic unit 950 and a sub-logic unit 960. The two inputs of the sub-logic unit 930 respectively receive the gate control signal NG and the delay signal ND, and its output terminal is coupled to one input of the sub-logic unit 920. The sub-logic unit 920 also receives the delay signal ND and the control signal CTRL. In short, the logic unit 910 refers to the control signal CTRL, the gate control signal NG and the delay signal ND to generate the gate control signal PG. Similarly, the two terminals of the sub-logic unit 960 respectively receive the gate control signal PG and the delay signal PD, and its output terminal is coupled to one terminal of the sub-logic unit 950. The sub-logic unit 950 also receives the delay signal PD and the control signal CTRL. In short, the logic unit 940 refers to the control signal CTRL, the gate control signal PG and the delay signal PD to generate the gate control signal NG.

In contrast to the embodiment of FIG. 4, the sub-logic unit 920 further comprises an OR gate 925, one terminal of which receives the delay signal ND and the other receives a logic signal NS; similarly, the sub-logic unit 950 further comprises an AND gate 955, one terminal of which receives the delay signal PD and the other receives a logic signal PS. The logic signal NS and the logic signal PS are respectively generated by the sub-logic unit 930 and the sub-logic unit 960. A main function of the sub-logic unit 930 is to calculate a delay time from a transition from low level to high level of the gate control signal NG to a corresponding transition of the delay signal ND, i.e., a delay time from the logic circuit 905 controlling the NMOS 420 to turn on to the delay signal ND actually reflecting the on state of the NMOS 420. A main function of the sub-logic unit 960 is to calculate a delay time from a transition from high level to low level of the gate control signal PG to a corresponding transition of the delay signal PD, i.e., a delay time from the logic circuit 905 controlling the PMOS 410 to turn on to the delay signal PD actually reflecting the on state of the PMOS 410. A timing diagram of each signal shown in FIG. 10 explains the operation of the switching regulator 900 according to this embodiment.

Figure 10:
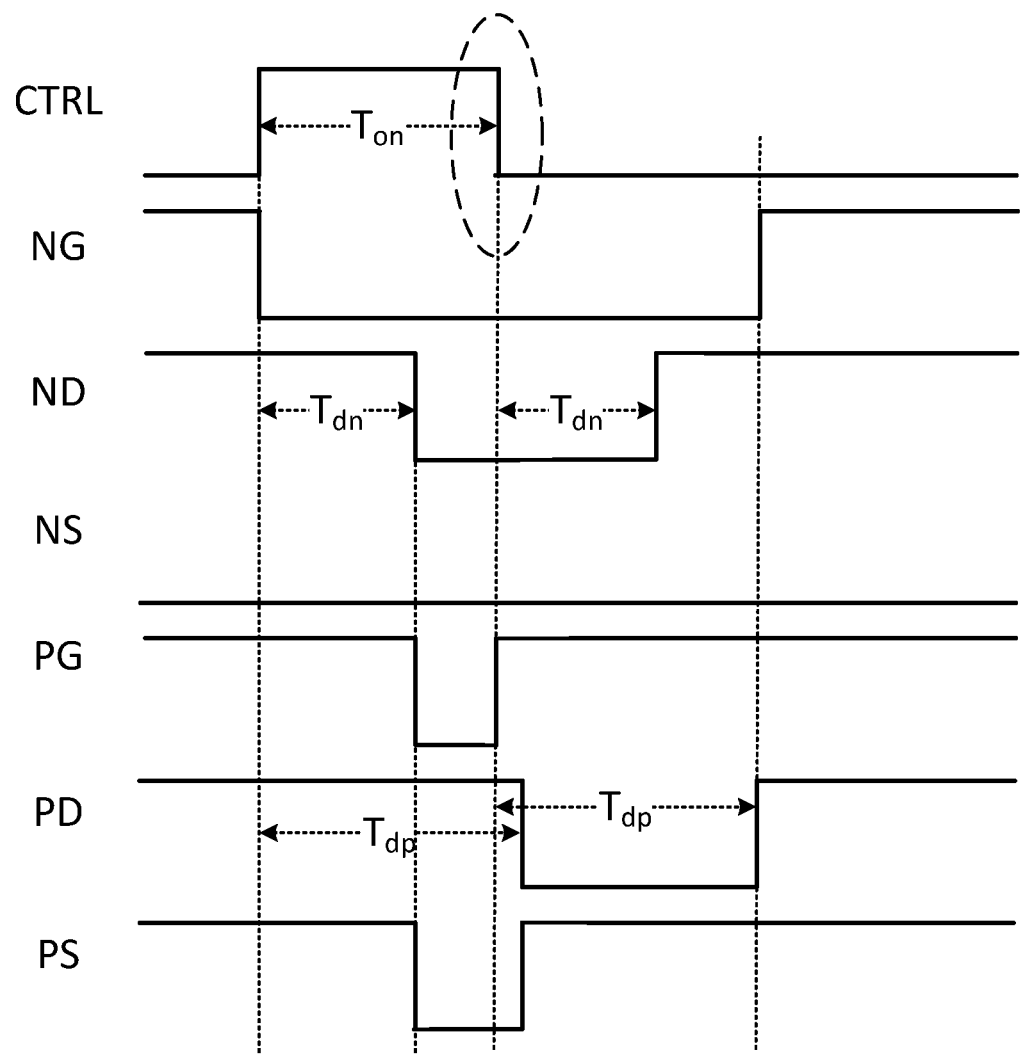
FIG. 10 illustrates a timing diagram of the control signals, the delay signals and the logic signals of a switching regulator of the present invention.

As shown in FIG. 10, a delay time Tdn after the control signal CTRL transits from low level to high level (i.e., in order to turn on the PMOS 410), the delay signal ND transits and the gate control signal PG also transits accordingly to low level to turn on the PMOS 410. If the delay time of the delay unit 460 and that of the delay unit 470 are the same, the delay signal PD is supposed to also transit accordingly to low level at the time. However, due to the variations in the manufacturing process and the environment, the delay time of the delay unit 460 may probably differ from that of the delay unit 470 (in this illustrative example, Tdn<Tdp), which causes the delay signal PD to fall behind the gate control signal PG. During the delay time, the logic signal PS is at low level to reflect that the delay signal PD and the gate control signal PG do not synchronize. This design has at least the following advantage: when the logic signal PS is at low level, the AND gate 955 ignores the delay signal PD, which did not reflect the transition of the gate control signal PG at the time, and the high level signal outputted by the NOT gate 442 also makes the NOR gate 444 ignores the control signal CTRL at the time; as a result, when the logic signal PS is at low level and the control signal CTRL wants to turn on the NMOS 420, as depicted by the dotted circle in FIG. 10, the gate control signal PG promptly transits to turn off the PMOS 410 while the gate control signal NG, affected by the logic signal PS, remains at low level to avoid mistakenly turning on the NMOS 420 in response to the high level delay signal PD. In short, even if the delay unit 460 and the delay unit 470 differ in delay time due to the variations in the manufacturing process and the environment, this circuit of this embodiment can still prevent short currents from happening. The sub-logic unit 920 and the sub-logic unit 930 have similar operating principles, so detailed descriptions are omitted for brevity. Moreover, even if the buck-boost converters are taken into consideration, this circuit is not influenced by the parasitic delays caused by the buck-boost converters, making the circuit safer and more stable.

The sub-logic unit 930 can be implemented by an SR latch 935, which receives the gate control signal NG at its set input S, the delay signal ND at its reset input R, and outputs the logic signal NS at its in-phase output Q. The sub-logic unit 960 can be implemented by an SR latch 965, which receives an inversion of the gate control signal PG at its set input S, an inversion of the delay signal PD at its reset input R, and outputs an inversion of the logic signal PS at its in-phase output Q.

Figure 11:
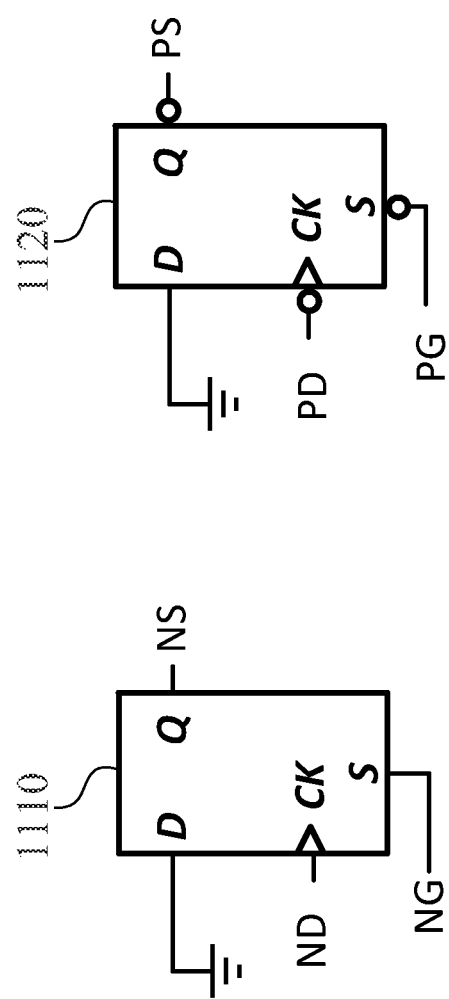
FIG. 11 illustrates D Flip Flops that implement the sub-logic units of the present invention.

The circuits that implement the sub-logic unit 930 and the sub-logic unit 960 are not limited to the aforementioned SR latches 935 and 965; for example, the sub-logic unit 930 can be implemented by a D Flip Flop 1110 shown in FIG. 11 and the sub-logic unit 960 can be implemented by a D Flip Flop 1120 also shown in FIG. 11. The D Flip Flop 1110 has its data input D coupled to ground, its clock input CK coupled to the delay signal ND, its set input S coupled to the gate control signal NG, and outputs the logic signal NS at its in-phase output Q. The D Flip Flop 1120 has its data input D coupled to ground, its clock input CK coupled to an inversion of the delay signal PD, and its set input S coupled to an inversion of the gate control signal PG, and an inversion of the output signal at its in-phase output Q becomes the logic signal PS. The operation principles of the D Flip Flop are well known to people having ordinary skill in the art and are omitted for brevity.

Although in the aforementioned embodiments the gate control signal NG is designed not to be at high level when the gate control signal PG is at low level, i.e., the gate control signals PG/NG are designed not to respectively be at low/high levels at the same time, these embodiments are not limited to using NMOS or PMOS as switches. Besides, a slight modification to the circuit will yield different combinations of signal levels to control the switches; for example by adding a NOT gate to the output terminal of the NAND gate 434 and/or the NOR gate 444, or replacing the NAND gate 434 with an AND gate and/or replacing the NOR gate 444 with an OR gate will make the gate control signals PG/NG not respectively at low/low, high/low and high/high levels at the same time. Other kinds of modifications can be perceived by people having ordinary skill in the art according to the disclosures of the present invention and are therefore omitted for brevity.

The shape, size, and ratio of any element and the step sequence of any flow chart in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A pulse generation circuit for generating a pulse signal at an output terminal, comprising:
   a PMOS having a source coupled to a first reference voltage level, a drain coupled to the output terminal, and a gate coupled to receive a first gate control signal;
   an NMOS having a source coupled to a second voltage level, a drain coupled to the output terminal, and a gate coupled to receive a second gate control signal; and
   a logic circuit, coupled to the gate of the PMOS and the gate of the NMOS, for generating the first gate control signal according to a control signal and a first delay signal and generating the second gate control signal according to the control signal and a second delay signal;
   wherein the first delay signal is a delay of a first logic signal generated according to the second gate control signal and the control signal, and the second delay signal is a delay of a second logic signal generated according to the first gate control signal and the control signal.

2. The pulse generation circuit of claim 1, wherein the logic circuit comprises:
   a first logic unit, coupled to the gate of the PMOS, for generating the first gate control signal according to the control signal and the first delay signal;
   a second logic unit, coupled to the gate of the NMOS, for generating the second gate control signal according to the control signal and the second delay signal;
   a third logic unit, coupled to the gate of the PMOS and the gate of the NMOS, for generating the first logic signal according to the second gate control signal and the control signal, and generating the second logic signal according to the first gate control signal and the control signal;
   a first delay unit, coupled between the third logic unit and the first logic unit, for delaying the first logic signal to generate the first delay signal; and
   a second delay unit, coupled between the third logic unit and the second logic unit, for delaying the second logic signal to generate the second delay signal.

3. The pulse generation circuit of claim 2, wherein the third logic unit comprises:
   an inverter, having an input coupled to receive the control signal;
   an OR gate, having an input coupled to the gate of the NMOS, the other input coupled to an output of the inverter, and an output outputting the first logic signal; and
   an AND gate, having an input coupled to the gate of the PMOS, the other input coupled to the output of the inverter, and an output outputting the second logic signal.

4. The pulse generation circuit of claim 2, wherein the first logic unit further refers to the second gate control signal to generate the first gate control signal, and the second logic unit further refers to the first gate control signal to generate the second gate control signal.

5. The pulse generation circuit of claim 4, wherein the first logic unit comprises:
   a first sub-logic unit, coupled to the gate of the NMOS and the first delay unit, for generating a third logic signal indicating a delay time between the second gate control signal and the first delay signal; and
   a second sub-logic unit, coupled to the first delay unit and the first sub-logic unit, for generating the first gate control signal according to the third logic signal and the first delay signal.

6. The pulse generation circuit of claim 5, wherein the first sub-logic unit is an SR latch, having a set input coupled to receive the second gate control signal, a reset input coupled to receive the first delay signal, and an in-phase output outputting the third logic signal.

7. The pulse generation circuit of claim 5, wherein the first sub-logic unit is a D Flip Flop, having a clock input coupled to receive the first delay signal, a data input coupled to a reference voltage level, a set input coupled to receive the second gate control signal, and an in-phase output outputting the third logic signal.

8. The pulse generation circuit of claim 4, wherein the second logic unit comprises:
   a first sub-logic unit, coupled to the gate of the PMOS and the second delay unit, for generating a third logic signal indicating a delay time between the first gate control signal and the second delay signal; and
   a second sub-logic unit, coupled to the second delay unit and the first sub-logic unit, for generating the second gate control signal according to the third logic signal and the second delay signal.

9. The pulse generation circuit of claim 8, wherein the first sub-logic unit is an SR latch, having a set input coupled to receive an inverse of the first gate control signal, a reset input coupled to receive an inverse of the second delay signal, and an in-phase output outputting an inverse of the third logic signal.

10. The pulse generation circuit of claim 8, wherein the first sub-logic unit is a D Flip Flop, having a clock input coupled to receive an inverse of the second delay signal, a data input coupled to a reference voltage level, a set input coupled to receive an inverse the first gate control signal, and an in-phase output outputting an inverse of the third logic signal.

11. A DC voltage generation circuit for generating a DC voltage, comprising:
   a low-pass filter, having an input terminal and an output terminal, for filtering a pulse signal to generate the DC voltage, which is outputted at the output terminal;
   a PMOS having a source coupled to a first reference voltage level, a drain coupled to the input terminal of the low-pass filter, and a gate coupled to receive a first gate control signal, the pulse signal being generated at the drain of the PMOS;
   an NMOS having a source coupled to a second reference voltage level, a drain coupled to the input terminal of the low-pass filter, and a gate coupled to receive a second gate control signal, the pulse signal being generated at the drain of the NMOS; and
   a logic circuit, coupled to the gate of the PMOS and the gate of the NMOS, for generating the first gate control signal according to a control signal and a first delay signal, and generating the second gate control signal according to the control signal and a second delay signal;
   wherein the first delay signal is a delay of a first logic signal generated according to the second gate control signal and the control signal, and the second delay signal is a delay of a second logic signal generated according to the first gate control signal and the control signal.

12. The DC voltage generation circuit of claim 11, wherein the logic circuit comprises:
a first logic unit, coupled to the gate of the PMOS, for generating the first gate control signal according to the control signal and the first delay signal;
a second logic unit, coupled to the gate of the NMOS, for generating the second gate control signal according to the control signal and the second delay signal;
a third logic unit, coupled to the gate of the PMOS and the gate of the NMOS, for generating the first logic signal according to the second gate control signal and the control signal, and generating the second logic signal according to the first gate control signal and the control signal;
a first delay unit, coupled between the third logic unit and the first logic unit, for delaying the first logic signal to generate the first delay signal; and
a second delay unit, coupled between the third logic unit and the second logic unit, for delaying the second logic signal to generate the second delay signal.

13. The DC voltage generation circuit of claim 12, wherein the third logic unit comprises:
an inverter, having an input coupled to receive the control signal;
an OR gate, having an input coupled to the gate of the NMOS, the other input coupled to an output of the inverter, and an output outputting the first logic signal; and
an AND gate, having an input coupled to the gate of the PMOS, the other input coupled to the output of the inverter, and an output outputting the second logic signal.

14. The DC voltage generation circuit of claim 12, wherein the first logic unit further refers to the second gate control signal to generate the first gate control signal, and the second logic unit further refers to the first gate control signal to generate the second gate control signal.

15. The DC voltage generation circuit of claim 14, wherein the first logic unit comprises:

a first sub-logic unit, coupled to the gate of the NMOS and the first delay unit, for generating a third logic signal indicating a delay time between the second gate control signal and the first delay signal; and
a second sub-logic unit, coupled to the first delay unit and the first sub-logic unit, for generating the first gate control signal according to the third logic signal and the first delay signal.

16. The DC voltage generation circuit of claim 15, wherein the first sub-logic unit is an SR latch, having a set input coupled to receive the second gate control signal, a reset input coupled to receive the first delay signal, and an in-phase output outputting the third logic signal.

17. The DC voltage generation circuit of claim 15, wherein the first sub-logic unit is a D Flip Flop, having a clock input coupled to receive the first delay signal, a data input coupled to a reference voltage level, a set input coupled to receive the second gate control signal, and an in-phase output outputting the third logic signal.

18. The DC voltage generation circuit of claim 14, wherein the second logic unit comprises:
a first sub-logic unit, coupled to the gate of the PMOS and the second delay unit, for generating a third logic signal indicating a delay time between the first gate control signal and the second delay signal; and
a second sub-logic unit, coupled to the second delay unit and the first sub-logic unit, for generating the second gate control signal according to the third logic signal and the second delay signal.

19. The DC voltage generation circuit of claim 18, wherein the first sub-logic unit is an SR latch, having a set input coupled to receive an inverse of the first gate control signal, a reset input coupled to receive an inverse of the second delay signal, and an in-phase output outputting an inverse of the third logic signal.

20. The DC voltage generation circuit of claim 18, wherein the first sub-logic unit is a D Flip Flop, having a clock input coupled to receive an inverse of the second delay signal, a data input coupled to a reference voltage level, a set input coupled to receive an inverse the first gate control signal, and an in-phase output outputting an inverse of the third logic signal.

* * * * *